United States Patent [19]
Akatsu et al.

[11] Patent Number: 5,932,493
[45] Date of Patent: Aug. 3, 1999

[54] METHOD TO MINIMIZE WATERMARKS ON SILICON SUBSTRATES

[75] Inventors: Hiroyuki Akatsu, Yorktown Heights; Ronald Hoyer, Poughkeepsie; Ravikumar Ramachandran, Beacon, all of N.Y.

[73] Assignee: International Business Machines Corporaiton, Armonk, N.Y.

[21] Appl. No.: 08/929,590

[22] Filed: Sep. 15, 1997

[51] Int. Cl.$^6$ .................................................. H01L 21/00
[52] U.S. Cl. ................................ 438/745; 134/2; 134/26; 216/99; 438/748
[58] Field of Search .......................... 134/2, 22.14, 22.19, 134/26, 27; 216/2, 99; 438/689, 745, 748–753

[56] References Cited

U.S. PATENT DOCUMENTS

| | | |
|---|---|---|
| 4,968,381 | 11/1990 | Prigge et al. . |
| 5,409,544 | 4/1995 | Ota et al. . |
| 5,520,744 | 5/1996 | Fujikawa et al. . |
| 5,593,538 | 1/1997 | Davison et al. ..................... 438/756 X |

OTHER PUBLICATIONS

A. Adamson; Surface Films On Liquid Substrates; Physical Chemistry of Surfaces; 4$^{th}$ Edition; pp. 104–107.
R. Hunter et al.; Emulsions; Foundation of Colloid Science; vol. 2, pp. 916–919.
A. Adamson; Emulsions And Foams; Physical Chemistry of Surfaces; 4$^{th}$ edition; pp. 474–477.
G. Gould et al.; An In Situ Study Of Aqueous HF Treatment Of Silicon By Contact Angle Measurement And Ellipsometry; J. Electrochem. Soc., vol. 135, No. 6, Jun. 1988 pp. 1535–1539.
Jin–Goo Park et al.; Effects Of Drying Methods And Wettability Of Silicon On The Formation Of Water Marks In Semiconductor Processing; J. Electrochem. Soc., vol. 142, No. 6, Jun. 1995 pp. 2028–2031.

*Primary Examiner*—William Powell
*Attorney, Agent, or Firm*—Whitham, Curtis & Whitham; Daryl K. Neff

[57] ABSTRACT

Formation of watermarks during semiconductor processing can be prevented by rinsing silicon wafers in an organic solvent prior to drying. Water droplets on the silicon wafer surface are taken up by the solvent and film is formed over the wafer surface. Following this rinse, the wafer may be subjected to standard IPA-based drying techniques.

14 Claims, No Drawings

METHOD TO MINIMIZE WATERMARKS ON SILICON SUBSTRATES

BACKGROUND OF THE INVENTION

1. Field of the Invention

The present invention generally relates to semiconductor chip manufacture and more particularly to prevention of watermark formation on chips during manufacturing steps.

2. Background Description

A wafer drying step is crucial in the semiconductor manufacturing industry, and by reducing the formation of surface defects called "watermarks" during wafer drying, the yields can be substantially increased.

Typically after the etching of an oxide film from the silicon surface of a wafer or chip with an etchant such as a dilute hydrofluoric (DHF) or buffered hydrofluoric (BHF) solution, the wafers or chips are rinsed in deionized (DI) water to remove the chemicals. After the final rinse in DI water, the wafers are dried either in an isopropyl alcohol (IPA) dryer or a spin dryer or other suitable device. The oxide etch process makes the wafer or chip surface highly hydrophobic and reactive and this surface leaves watermark defects after drying. Park et al. conclude that spin dried hydrophobic wafers create a large number of watermarks on patterned wafers with both hydrophilic and hydrophobic sites ("Effects of Drying Methods and Wettability of Silicon on the Formation of Water Marks in Semiconductor Processing," *J. Electrochem. Soc.*, Vol. 142, No. 6, June 1995, pp. 2028–2031).

Watermarks are always seen when wafers with a bare silicon surface (single crystal or polysilicon and H-passivation) are rinsed in high purity water in the presence of oxygen. This occurs after processes which finish with an HF-dip as the last step and all poly-chemical-mechanical polishing steps watermarks densely cover the wafer surface. While there are many steps in which watermarks are formed, each step varies as to the risk of watermark formation.

In the semiconductor industry after the final water clean steps, the wafers may be dried by spindrying, conventional type isopropyl alcohol (IPA) based drying, or other known techniques.

With respect to watermarks, Park et al. reported that spin drying results in watermarks that are around ten microns in size, and IPA drying results in watermarks of a size less than 1 micron. However, Park et al. observed watermarks with IPA dryer for patterned wafers only. The patterned wafers had hydrophilic (oxide coated and cleaned surfaces) and hydrophobic (etched surfaces) regions. All wafer dryers, except for the spin dryer, use IPA as the solvent of choice. The complete miscibility of water with IPA, and the presence of an azeotropic temperature close to 80° C. may result in the formation of watermarks.

SUMMARY OF THE INVENTION

It is an object of the present invention to provide an improved method for removing water from wafers during semiconductor fabrication which will prevent watermark formation.

The inventive method adds rinsing steps prior to each drying step in semiconductor processing. Prior to drying, the wafer is rinsed in deionized (DI) water. Then the wafer is rinsed in an organic solvent, preferably a long chain alcohol. The mixing of the water with the solvent reduces the surface tension of water droplets which remain on the wafer surface following the DI rinse. In addition, a film is created on the wafer surface. This film is removed by a standard drying procedure.

DETAILED DESCRIPTION OF A PREFERRED EMBODIMENT OF THE INVENTION

This invention involves the dipping/rinsing of wafers or other silicon substrates (e.g., silicongermanium or silicon-on-insulator (SOI))in an organic solvent after rinsing with deionized (DI) water. The solvent preferably has the following properties:

a) low surface tension (less than 30 dynes/cm);

b) some interaction with water to keep the $\gamma AB$ (solvent-water interfacial energy) as small as possible (preferably less than 15 dynes/cm);

c) some solubility of the water in the solvent phase; and d) good wettability of the silicon wafer surface.

The organic solvent preferably contains at least 5 carbon atoms, more preferably 5–14 carbons, most prerably 6–12 carbons. One class of organic solvents that would be effective in reducing watermarks is long-chain alcohols. Other solvents, like organic acids, aldehydes, and esters, may also be effective in preventing the watermarks. The particular solvent should be such that it could be stripped off easily from the wafer surface, such as dissolving in a small chain alcohol (e.g., ethanol or isopropanol) or other suitable organic solvent.

The critical surface tension of a silicon surface has been reported by Gould et al. to be 27 dynes/cm (or mN/m) (*J. Electrochem. Soc.*, Vol. 135, p. 1535 (1988)). For any liquid with surface tension less than or equal to the critical surface tension of the solid, the liquid will wet the surface of the solid. For alcohols, where the number of carbon groups in them is between 5 and 14, the surface tension values are between 24 and 30 dynes/cm (or mN/m) at room temperature (20–25° C.).

Water droplets have a finite contact angle on a hydrophobic silicon surface, and will wet the surface of hydrophilic silicon dioxide. A finite contact angle is a result of the balance of the surface energies of the solid-vapor, solid-liquid, and liquid-vapor interfaces. Spreading occurs if a liquid wets the surface of the solid.

After (preferably immediately after) the last rinse of the wafers in DI water, the wafers are exposed to the solvent preferably by immersion, spraying or other suitable technique. Because the solvent has a lower surface tension than water, it will initially spread on a water film spontaneously.

For alcohols, as the chain length (number of carbons) increases, the solubility of the alcohol in water decreases, and so does the water solubility in the alcohol. Table 1 summarizes the solubility related data for alcohol in water and water in alcohol.

TABLE 1

| Alcohol | Solubility of alcohol in water, wt % | Solubility of water in alcohol, wt % |
| --- | --- | --- |
| Isopropyl alcohol (C3) | 100.0 | 100.0 |
| Hexanol (C6) | 0.59 | 7.2 |
| Heptanol (C7) | 0.13 | 5.1 (for 2-Heptanol) |

TABLE 1-continued

| Alcohol | Solubility of alcohol in water, wt % | Solubility of water in alcohol, wt % |
|---|---|---|
| Octanol (C8) | 0.054 | 3.8 (for iso-octanol) |
| Decanol (C10) | 0.0037 | 2.3 |
| Dodecanol (C12) | 0.0004 | |

Data for this table was taken from:
MSDS Data Sheets;
Flick, E. W. Ed. Industrial Solvents Handbook, Noyes Data Corp., N. J. (1985);
Marsden, C. Ed. Solvents Guide, Cleaver-Hume Press Ltd., London (1963).

The organic solvent initially spreads on the residual water present on the wafer surface, and the water gets stabilized in the organic solvent phase in the form a water-in-solvent emulsion. The stability of the water in the solvent can be addressed by calculating the hydrophilic-lipophilic balance (HLB) as proposed by Davies (Adamson, A.W., *Physical Chemistry of Surfaces,* John Wiley & Sons, New York (1982). For an alcohol represented by $R_n$-OH, where R is the alkyl group, n is the number of carbon atoms in the alkyl chain, and OH is the hydroxide group, the HLB number is calculated from the following formula:

$$HLB = 7 + n(-0.475) + 1.9$$

The HLB numbers calculated for some of the alcohols are the following: n =6, HLB is 6.05; n =8, HLB is 5.1; n =10, HLB is 4.15; and n =12, HLB is 3.2. Typical water in oil emulsions form the HLB range from 3 to 6 (Hunter, R.J., *Foundations of Colloid Science: Volume II,* Oxford University Press, New York (1991). In the practice of this invention, organic solvents, such as long chain alcohols, with an HLB ranging from 2 to 7 are preferred.

After the solvent exposure step, most of the water may be present in the solvent as an emulsion of water in solvent. The water droplet may be stabilized in the organic solvent phase by the addition of trace quantities of non-ionic surfactants (such as, for example, polyethylene oxide based surfactants).

To implement the inventive process in tank tools, following final water rinse, the wafers may be dipped into a tank containing the organic solvent. Alternatively, in a tank which fills at the top and drains at the bottom, the organic solvent would be introduced at the time when the water from the last rinse starts to recede from the wafer surface. Here, the solvent selectively interacts with the residual water on the wafer, and does not mix with the water mass receding from the wafer surface.

The organic solvents preferably have relatively high flash temperatures compared to room temperature of 20° C. Some of the flash temperatures for different alcohols are shown in table 2.

| Alcohol | Flash Temperature, (° C.) |
|---|---|
| Hexanol (C6) | 54 |
| Decanol (C10) | 107.2 |
| Dodecanol (C12) | 127 |

Therefore, even for an open bath, the appropriate solvent could be used to minimize flammability concerns for industrial use. Also, for the choice range of organic solvents (especially alcohols), the relative health hazards and reactivity concerns are minimal. Having the solvent temperature higher (at some safe value below the flash temperature) may help remove the water form the wafer surface also. In the preferred embodiment, the flash temperature of the solvent will be greater than or equal to 30° C.

After the solvent exposure step, the amount of water on the wafer surface is reduced significantly. Higher alcohols are soluble in lower alcohols (like ethanol and isopropanol). Therefore, if the wafers are introduced into an IPA dryer, higher alcohols are removed from the wafer surface. Reducing the amount of water remaining on the wafer surface drastically due to the organic solvent exposure step, reduces the extent of formation of watermarks of the wafer surface considerably.

In summary, introduction of a solvent, such as long chain alcohol, after the water rinse step will help reduce the formation of watermarks. The preferred solvents have surface tension values between 20 and 30 dynes/cm, and are water soluble to a small extent. The interfacial surface tension of water-solvent is preferably approximately less than 15 dynes/cm. The preferred solvents, which are long chain alcohols having 5–14 carbons, in operation, will wet a hydrophobic silicon surface, spread initially on water, and have some amount of water solubility in them. After organic solvent (e.g., long chain alcohol) exposure, which can be accomplished by any suitable means such as dipping, rinsing, spraying, etc., the water concentration on the wafer surface will be drastically reduced. The organic solvent is then preferably removed by rinsing with another solvent such as a small chain alcohol (i.e., 1–4 carbons), most preferably ethanol and/or isopropanol (e.g., in an IPA dryer). Thus, by this technique, the watermarks on the substrate would be reduced so that there will be higher yields of product.

While the invention has been described in terms of its preferred embodiments, those skilled in the art will recognize that the invention can be practiced with modification within the spirit and scope of the appended claims.

We claim:

1. A method for removing water from a substrate surface comprising the steps of:

exposing a silicon substrate to water; then applying a first organic solvent to said silicon substrate;

and removing first organic solvent and water from said silicon substrate.

2. A method as in claim 1, wherein said first organic solvent has a surface tension of less than 30 dynes/cm.

3. A method as in claim 1, wherein said first organic solvent interacts with said water to keep interfacial energy less than 15 dynes/cm.

4. A method as in claim 1, wherein said organic solvent has a solubility in said water greater than or equal to 1 weight percent.

5. A method as in claim 1, wherein said first organic solvent is an alcohol or combination of alcohols having 5 to 14 carbons.

6. A method as in claim 1, wherein said first organic solvent has a hydrophilic-lipophilic balance (HLB) between 2 and 7.

7. A method as in claim 1 wherein said first organic solvent has a flash temperature greater than or equal to 30° C.

8. A method as in claim 1, wherein said first organic solvent is selected from the group consisting of alcohols, aldehydes, esters, and acids.

9. A method as in claim 1, wherein said first organic solvent is an alcohol or combination of alcohols having 6 to 12 carbons.

10. The method of claim 9 wherein said organic solvent is selected from the group consisting of hexanol, decanol and dodecanol.

11. The method of claim 1 wherein said removing comprises:

applying a second organic solvent to said silicon substrate; and then drying said silicon substrate.

12. The method of claim 11 wherein said second organic solvent has 1 to 4 carbons.

13. The method of claim 12 wherein said second organic solvent is selected from the group consisting of ethanol and isopropanol.

14. The method of claim 1 wherein said silicon substrate is selected from the group consisting of silicon, silicon-germanium, and silicon-on-insulator (SOI).

* * * * *

UNITED STATES PATENT AND TRADEMARK OFFICE
CERTIFICATE OF CORRECTION

PATENT NO.: 5,932,493
DATED: August 3, 1999
INVENTORS: Hiroyuki Akatsu, Ronald Hoyer, and Ravikumar Ramachandran It is certified that error appears in the above-identified patent and that said Letters Patent is hereby corrected as shown below.

Title page item [75], inventor Hiroyuki Akatsu, please change "Yorktown Heights" to --Mohegan Lake--.

Signed and Sealed this

Twenty-ninth Day of February, 2000

*Attest:*

Q. TODD DICKINSON

*Attesting Officer*  *Commissioner of Patents and Trademarks*